United States Patent
Colvin et al.

(10) Patent No.: US 10,361,069 B2
(45) Date of Patent: Jul. 23, 2019

(54) ION SOURCE REPELLER SHIELD COMPRISING A LABYRINTH SEAL

(71) Applicant: Axcelis Technologies, Inc., Beverly, MA (US)

(72) Inventors: Neil K. Colvin, Merrimack, NH (US); Tseh-Jen Hsieh, Rowley, MA (US); Paul B. Silverstein, Somerville, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 15/477,680

(22) Filed: Apr. 3, 2017

(65) Prior Publication Data

US 2017/0287579 A1    Oct. 5, 2017

Related U.S. Application Data

(60) Provisional application No. 62/317,892, filed on Apr. 4, 2016.

(51) Int. Cl.
*G21F 1/06* (2006.01)
*H01J 9/32* (2006.01)
(Continued)

(52) U.S. Cl.
CPC .......... *H01J 37/32431* (2013.01); *G21F 1/06* (2013.01); *H01J 9/32* (2013.01);
(Continued)

(58) Field of Classification Search
None
See application file for complete search history.

(56) References Cited

U.S. PATENT DOCUMENTS

| | | |
|---|---|---|
| 5,262,652 A | 11/1993 | Bright |
| 5,497,006 A | 3/1996 | Sferiazzo et al. |

(Continued)

FOREIGN PATENT DOCUMENTS

JP    2010073387 A    4/2010

OTHER PUBLICATIONS

International Search Report and the Written Opinion of the International Searching Authority, dated Feb. 21, 2017 for PCT/US2016/060570.

(Continued)

*Primary Examiner* — James Choi
(74) *Attorney, Agent, or Firm* — Eschweiler & Potashnik, LLC

(57) ABSTRACT

An arc chamber liner has first and second surfaces and a hole having a first diameter. A liner lip having a second diameter extends upwardly from the second surface toward the first surface and surrounds the hole. An electrode has a shaft with a third diameter and a head with a fourth diameter. The third diameter is less than the first diameter and passes through the body and hole and is electrically isolated from the liner by an annular gap. The head has a third surface having an electrode lip extending downwardly from the third surface toward the second surface. The electrode lip has a fifth diameter between the second and fourth diameters. A spacing between the liner and electrode lips defines a labyrinth seal to generally prevent contaminants from entering the annular gap. The shaft has an annular groove configured to accept a boron nitride seal.

20 Claims, 8 Drawing Sheets

(51) Int. Cl.
 *H01J 37/08* (2006.01)
 *H01J 37/32* (2006.01)
 *H01J 37/317* (2006.01)
 *H01J 27/08* (2006.01)
 *H01J 11/28* (2012.01)

(52) U.S. Cl.
 CPC .............. *H01J 27/08* (2013.01); *H01J 37/08* (2013.01); *H01J 37/3171* (2013.01); *H01J 37/32541* (2013.01); *H01J 37/32559* (2013.01); *H01J 11/28* (2013.01); *H01J 2237/022* (2013.01); *H01J 2237/0213* (2013.01); *H01J 2237/03* (2013.01); *H01J 2237/31701* (2013.01)

(56) References Cited

U.S. PATENT DOCUMENTS

| | | | |
|---|---|---|---|
| 6,501,078 | B1 | 12/2002 | Ryding et al. |
| 7,033,444 | B1* | 4/2006 | Komino ................. C23C 16/46 |
| | | | 118/723 E |
| 9,006,690 | B2 | 4/2015 | Colvin et al. |
| 2005/0229849 | A1* | 10/2005 | Silvetti ............... C23C 16/4404 |
| | | | 118/715 |
| 2006/0030134 | A1 | 2/2006 | Kim et al. |
| 2007/0212200 | A1* | 9/2007 | Ueda ................. H01L 21/68742 |
| | | | 414/217 |
| 2008/0230713 | A1 | 9/2008 | Huang |
| 2009/0008570 | A1 | 1/2009 | Chen |
| 2011/0156570 | A1 | 6/2011 | Jerez |
| 2011/0240889 | A1 | 10/2011 | Colvin et al. |
| 2012/0013249 | A1 | 1/2012 | Jerez |
| 2014/0319994 | A1* | 10/2014 | Colvin ..................... F16J 15/02 |
| | | | 313/231.71 |
| 2015/0179393 | A1 | 6/2015 | Colvin et al. |
| 2015/0270100 | A1 | 9/2015 | Jerez et al. |

OTHER PUBLICATIONS

Notice of Allowance dated Jan. 22, 2018 in connection with U.S. Appl. No. 15/344,602.
Notice of Allowance dated Dec. 11, 2017 in connection with U.S. Appl. No. 15/410,711.
Non-Final Office Action dated Aug. 3, 2017 in connection with U.S. Appl. No. 15/344,502.
International Search Report dated Jun. 7, 2017 for PCT/US2017/025845.

* cited by examiner

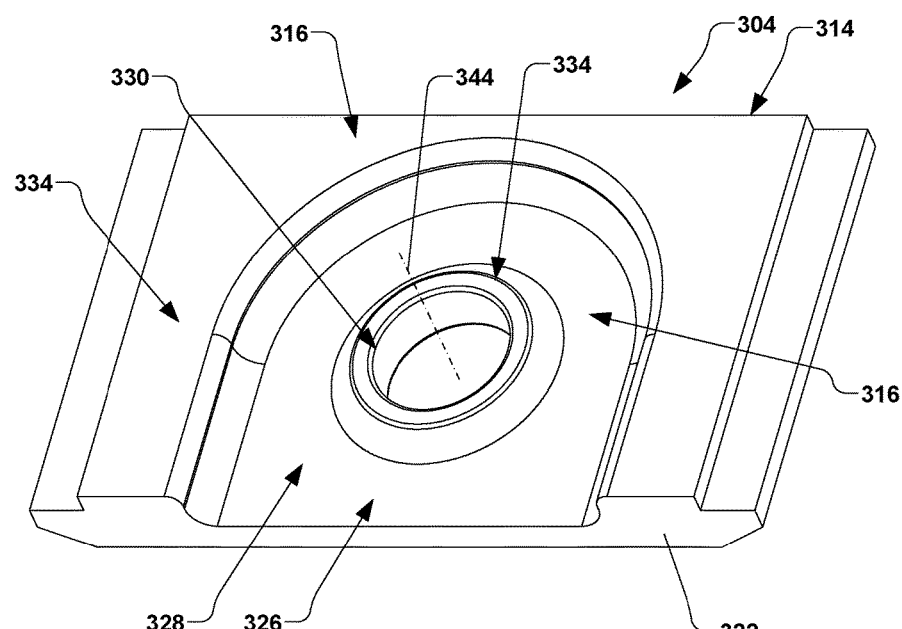
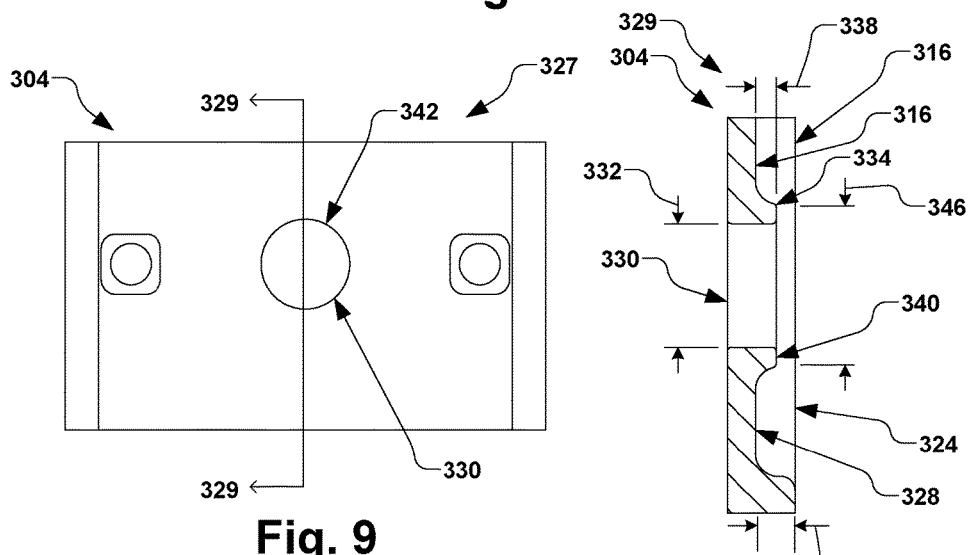

ION SOURCE REPELLER SHIELD COMPRISING A LABYRINTH SEAL

REFERENCE TO RELATED APPLICATIONS

This application claims the benefit of U.S. Provisional Application No. 62/317,892 filed Apr. 4, 2016, entitled "IMPROVED ION SOURCE REPELLER SHIELD", the contents of which are herein incorporated by reference in their entirety.

TECHNICAL FIELD

The present invention relates generally to ion implantation systems, and more specifically to an improved shield for a repeller of an ion source that improves a lifetime of a boron nitride seal, thus generally preventing leakage of gas out of the ion source.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Ion sources (commonly referred to as arc ion sources) generate ion beams used in implanters and can include heated filament cathodes for creating ions that are shaped into an appropriate ion beam for wafer treatment. U.S. Pat. No. 5,497,006 to Sferlazzo et al., for example, discloses an ion source having a cathode supported by a base and positioned with respect to a gas confinement chamber for ejecting ionizing electrons into the gas confinement chamber. The cathode of the Sferlazzo et al. is a tubular conductive body having an endcap that partially extends into the gas confinement chamber. A filament is supported within the tubular body and emits electrons that heat the endcap through electron bombardment, thereby thermionically emitting ionizing electrons into the gas confinement chamber.

Conventional ion source gases such as fluorine or other volatile corrosive species can etch the inner diameter of cathode and repeller seals over time, thereby allowing the volatile gases to escape and damage nearby insulators, such as a repeller assembly insulator. This leakage will shorten the useful lifetime of the ion source, thus resulting in shutting down of the ion implanter in order to replace parts therein.

SUMMARY

The present disclosure thus provides a system and apparatus for increasing the lifetime of an ion source. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, an ion source is provided, comprising an arc chamber having a body defining and interior region of the arc chamber. A liner is operably coupled to the body of the arc chamber, wherein the liner has a first surface and a second surface. The second surface, for example, is recessed from the first surface, therein defining a liner recess region. The liner further has a hole defined therethrough in the liner recess region, wherein the hole has a first diameter. The liner, for example, further comprises a liner lip extending upwardly from the second surface toward the first surface, wherein the liner lip surrounds the hole and has a second diameter associated therewith.

In accordance with another exemplary aspect, an electrode having a shaft and a head is further provided. The shaft has a third diameter that is less than the first diameter, wherein the shaft passes through the body and the hole in the liner. The shaft is further electrically isolated from the liner by an annular gap. The head of the electrode, for example, has a fourth diameter and comprises a third surface having an electrode lip extending downwardly from the third surface toward the second surface. The electrode lip, for example, has a fifth diameter associated therewith, wherein the fifth diameter is between the second diameter and the fourth diameter. Accordingly, a spacing between the liner lip and electrode lip generally defines a labyrinth seal and generally prevents contaminants from entering the annular gap.

According to another exemplary aspect, the ion source further comprises a boron nitride seal. The shaft, for example, further comprises an annular groove defined therein having a sixth diameter, wherein the sixth diameter is less than the third diameter. The boron nitride seal, for example, engages the annular groove, therein sealing the interior region of the arc chamber from an exterior region thereof. The annular groove, in conjunction with the liner lip and electrode lip, for example, generally define the labyrinth seal, therein reducing a gas conductance through the annular gap.

In one example, the boron nitride seal engages the annular groove of the shaft, therein sealing the interior region of the arc chamber from an exterior region thereof. In another example, the annular groove protects a sealing surface between the boron nitride seal and the shaft from corrosive gases.

In yet another example, the spacing between the liner lip and the electrode lip is approximately equal to the annular gap between the shaft and the liner. The electrode, for example, may comprise a repeller or anti-cathode. In another example, the labyrinth seal is defined in an outer diameter of the shaft, wherein the labyrinth seal is configured to accept a boron nitride seal. The labyrinth seal, for example, generally protects a sealing surface of the shaft from corrosive gases associated with the ion source by reducing conductance of the corrosive gases into an area associated with the boron nitride seal.

In another example, the boron nitride seal may be further disposed between the labyrinth seal and the arc chamber body, wherein the boron nitride seal electrically insulates the electrode from the arc chamber body. The labyrinth seal, for example, generally protects a sealing surface associated with the boron nitride seal from corrosive gases associated with the ion source by reducing a gas conductance of the corrosive gases into an area associated with the labyrinth seal.

In accordance with another exemplary aspect of the disclosure, an ion source, such as an ion source for an ion implantation system, is provided. The ion source, for example, comprises the arc chamber and a gas source, wherein the gas source is further configured to introduce a gas to the interior region of the arc chamber body.

In another example, the ion source further comprises a repeller disposed opposite the cathode. An arc slit may be further provided in the arc chamber for extraction of ions from the arc chamber.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 8 illustrates a perspective view of an exemplary ion source liner with a raised lip in accordance with several examples of the present disclosure.

FIG. 9 illustrates a bottom plan view of an exemplary ion source liner in accordance with several examples of the present disclosure.

FIG. 10 illustrates a cross-sectional view of FIG. 9 showing the ion source liner with a raised lip in accordance with several examples of the present disclosure.

DETAILED DESCRIPTION

Figure 1:
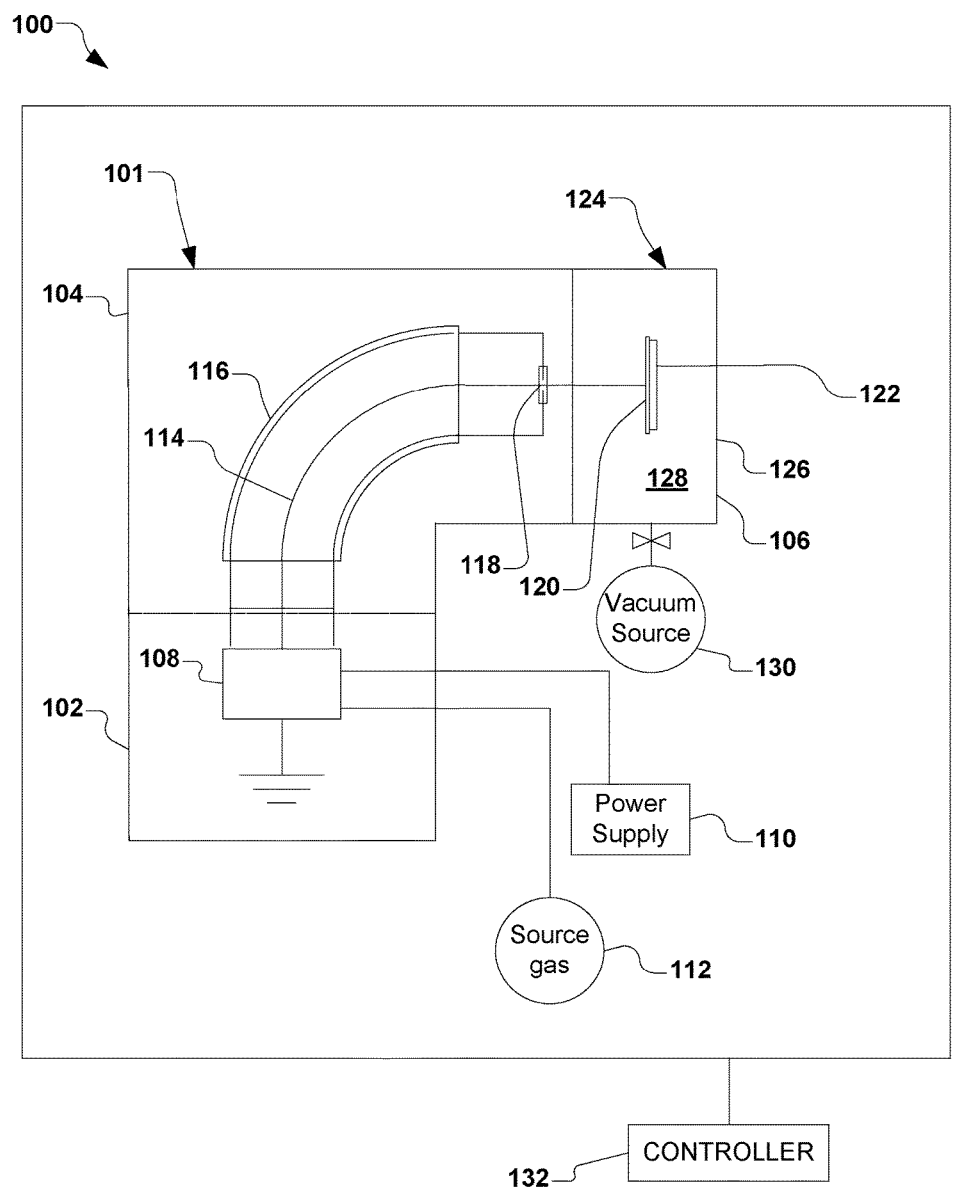
FIG. 1 is a block diagram of an exemplary vacuum system utilizing an ion source cathode shield in accordance with several aspects of the present disclosure.

The present disclosure is directed generally toward an ion implantation system and an ion source associated therewith. More particularly, the present disclosure is directed toward an improved arc chamber and components associated therewith for said ion source, whereby productivity of the ion source is improved.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, elements or other physical or functional units shown in the drawings or described herein could also be implemented by an indirect connection or coupling. Furthermore, it is to be appreciated that functional blocks or units shown in the drawings may be implemented as separate features in one embodiment, and may also or alternatively be fully or partially implemented in a common feature in another embodiment.

Referring now to the Figures, in accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110, whereby a source gas 112 (also called a dopant gas) supplied thereto is ionized into a plurality of ions to form an ion beam 114. The ion beam 114 in the present example is directed through a beam-steering apparatus 116, and out an aperture 118 towards the end station 106. In the end station 106, the ion beam 114 bombards a workpiece 120 (e.g., a semiconductor such as a silicon wafer, a display panel, etc.), which is selectively clamped or mounted to a chuck 122 (e.g., an electrostatic chuck or ESC). Once embedded into the lattice of the workpiece 120, the implanted ions change the physical and/or chemical properties of the workpiece. Because of this, ion implantation is used in semiconductor device fabrication and in metal finishing, as well as various applications in materials science research.

The ion beam 114 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 124, such as a vacuum chamber 126, wherein a process environment 128 is associated with the process chamber. The process environment 128 generally exists within the process chamber 124, and in one example, comprises a vacuum produced by a vacuum source 130 (e.g., a vacuum pump) coupled to the process chamber and configured to substantially evacuate the process chamber. Further, a controller 132 is provided for overall control of the vacuum system 100.

The present disclosure provides an apparatus configured to increase utilization and decrease downtime of the ion source 108 in the ion implantation system 101 discussed above. It shall be understood, however, that the apparatus of the present disclosure may be also implemented in other semiconductor processing equipment such as CVD, PVD, MOCVD, etching equipment, and various other semiconductor processing equipment, and all such implementations are contemplated as falling within the scope of the present disclosure. The apparatus of the present disclosure advantageously increases the length of usage of the ion source 108 between preventive maintenance cycles, and thus increases overall productivity and lifetime of the system vacuum 100.

The ion source 108 (also called an ion source chamber), for example, can be constructed using refractory metals (W, Mo, Ta, etc.) and graphite in order to provide suitable high temperature performance, whereby such materials are generally accepted by semiconductor chip manufacturers. The source gas 112 is used within the ion source 108, wherein source gas may or may not be conductive in nature. However, once the source gas 112 is cracked or fragmented, the ionized gas by-product can be very corrosive.

One example of a source gas 112 is boron tri-fluoride ($BF_3$), which can be used as a source gas to generate Boron-11 or $BF_2$ ion beams in the ion implantation system 101. During ionization of the $BF_3$ molecule, three free fluorine radicals are generated. Refractory metals, such as molybdenum and tungsten, can be used to construct or line the ion source chamber 108 in order to sustain its structural integrity at an operating temperature of around approximately 700° C. However, refractory fluoride compounds are volatile and have very high vapor pressures even at room temperature. The fluorine radicals formed within the ion source chamber 108 attack the tungsten metal (molybdenum or graphite) and form tungsten hexafluoride ($WF_6$) (molybdenum or carbon fluoride):

$$WF_6 \rightarrow W^+ + 6F^- \qquad (1)$$

or

$$(MoF_6 \rightarrow Mo^+ + 6F^-) \qquad (2)$$

Tungsten hexafluoride will typically decompose on hot surfaces. For example, in an ion source 200 illustrated in FIG. 2, the tungsten hexafluoride or other resultant material may decompose on surfaces 202 of various internal components 203 of the ion source, such as on surfaces of a cathode 204, a repeller 206 and arc slit optics (not shown) associated an arc chamber 208 of the ion source. This is called a halogen cycle as shown in equation (1), but the resultant material can also precipitate and/or condense back onto walls 210 or liners 212 or other components of the arc chamber 208, as well as the arc slit in the form of a contaminant material 214 (e.g., solid-state particulate contaminants). The liners 212, for example, comprise replaceable members 215 operably coupled to a body 216 of the arc chamber 208, wherein the liners are comprised of graphite or various other materials. The replaceable members 215, for example, provide wear surfaces that can be easily replaced after a period of operation of the arc chamber 208.

Another source of contaminant material 214 deposited onto the internal components 203 arises from the cathode 204 when the cathode is indirectly heated (e.g., a cathode composed of tungsten or tantalum), whereby the indirectly heated cathode is used to start and sustain the ion source plasma (e.g., a thermionic electron emission). The indirectly heated cathode 204 and the repeller 206 (e.g., an anti-cathode), for example, are at a negative potential in relation to the body 216 of the arc chamber 208, and both the cathode and repeller can be sputtered by the ionized gases. The repeller 206, for example, can be constructed from tungsten, molybdenum, or graphite. Yet another source of contaminant material 214 deposited on the internal components 203 of the arc chamber 208 is the dopant material (not shown), itself. Over time, these deposited films of contaminant material 214 can become stressed and subsequently delaminate, thereby shortening the life of the ion source 200.

Surface condition plays a significant role between a substrate and films deposited thereon. London dispersion force, for example, describes the weak interaction between transient dipoles or multi-poles associated with different parts of matter, accounting for a major part of the attractive van der Waals force. These results have significant implications in developing a better understanding of atomic and molecular adsorption on different metal substrates. Multi-scale modeling integrating first-principles calculations with kinetic rate equation analysis shows a drastic reduction in the growth temperature from 1000° C. to 250-300° C.

As the formation of a strong atomic bond within the interfacial region is unlikely to happen, the thermal expansion coefficient differences between the substrate (e.g., the cathode 204, liners 212, and/or repeller 206) and the deposited contaminant material 214, the thermal cycling when transitioning between high power and low power ion beams, and the dissociation of implant materials residing within the uneven plasma boundary can cause premature failure. The residual stresses in these deposits are of two types: one arises from imperfections during film growth; the other is due to mismatch in the coefficients of thermal expansion between substrate and the deposited film.

As the film thickness of the contaminant material 214 increases, tensile and/or compressive stresses will reach threshold levels at the interface with the substrate, and peeling or delamination can occur within the ion source 200. When such delamination of the contaminant material 214 occurs, the now-delaminated contaminant material can fall and pass through a gap 218 defined between the repeller 206 and the liner 212 of the body 216 of arc chamber 208, as illustrated in the partially enlarged view 219 of FIG. 3, where the gap electrically decouples the electrically biased repeller from the body of the arc chamber.

Figure 2:
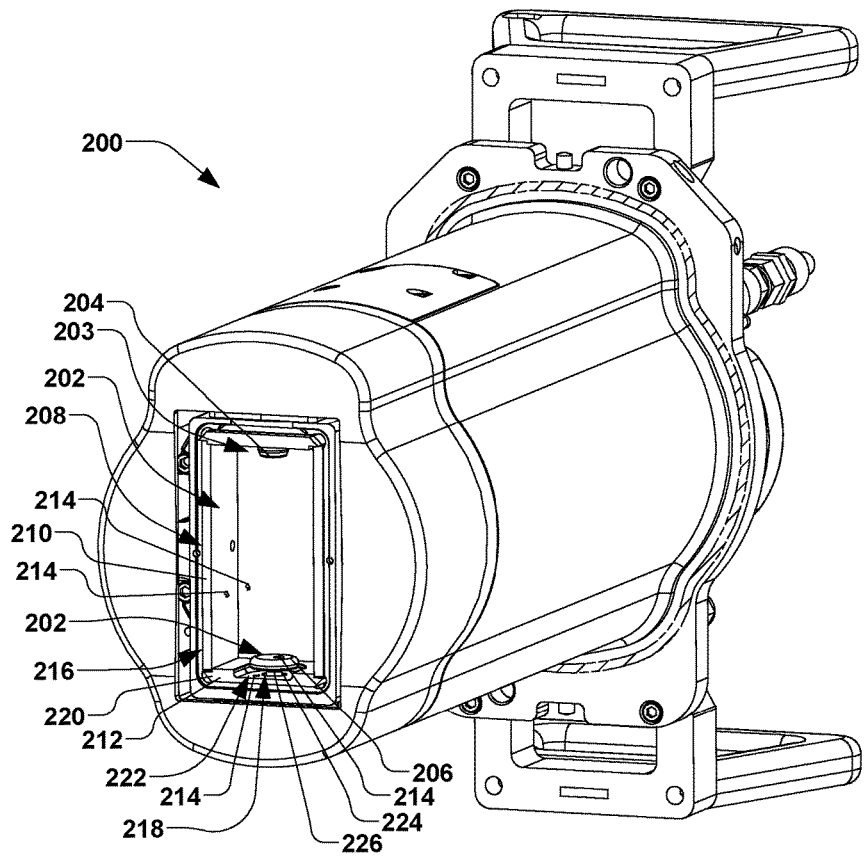
FIG. 2 illustrates a perspective view of an ion source in accordance with various aspects of the present disclosure.
Figure 3:
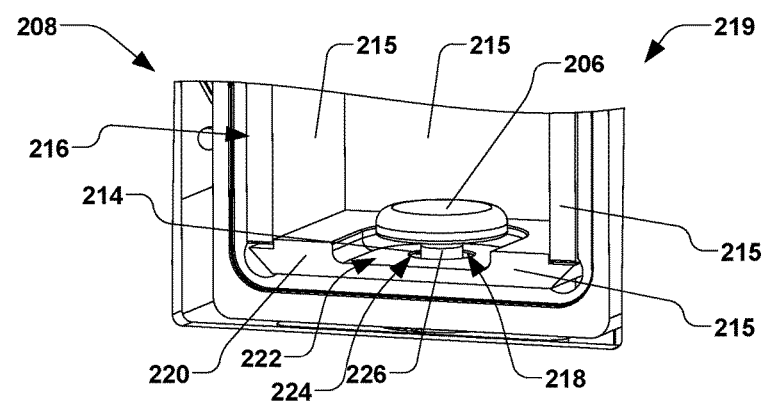
FIG. 3 illustrates a blown-up portion of FIG. 2 showing an arc chamber having a liner without a raised lip.
Figure 4:
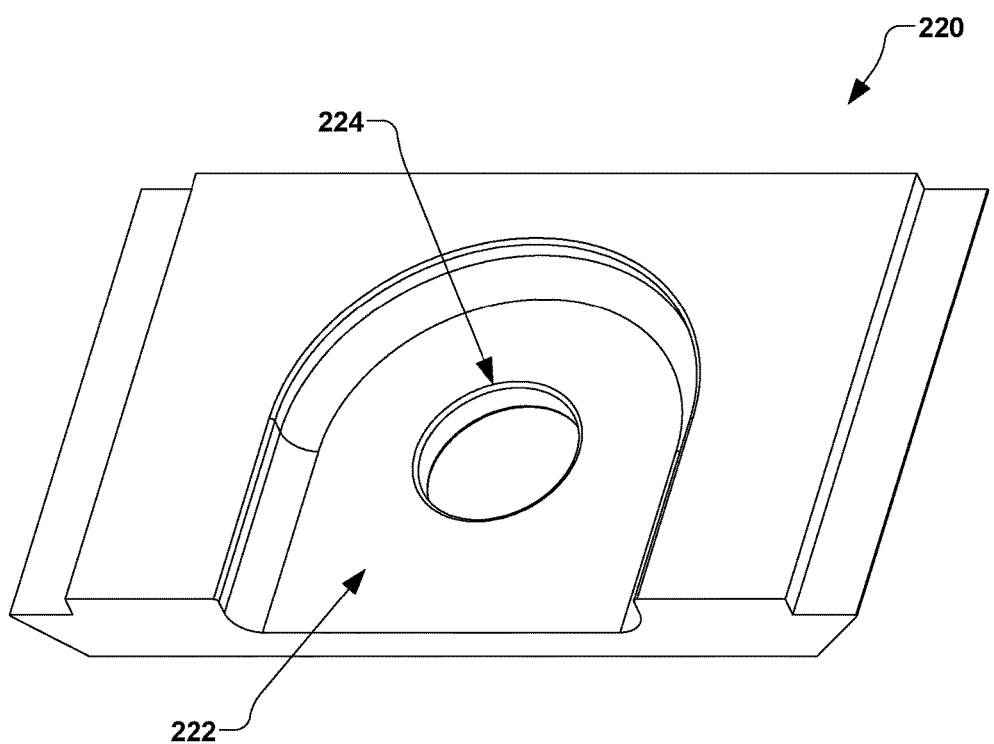
FIG. 4 illustrates a perspective view of an exemplary ion source liner.

FIG. 4 illustrates a bottom liner 220 that is provided in the ion source 200 of FIGS. 2 and 3, whereby the bottom liner comprises a recess 222 and a hole 224, and wherein the hole is configured to accept a shaft 226 of the repeller 206 of FIGS. 2 and 3. As such, the requisite gap 218 is provided between the shaft and bottom liner 220. It is noted, however, that the recess 222 is generally planar in order to accommodate the repeller 206 in the bottom liner 220 of FIG. 4. As illustrated in FIGS. 2 and 3, a head 228 of the repeller 206 masks a line of sight to the gap 218 between the shaft 226 of the repeller and the body 216 of arc chamber 208. However, small particles of contaminant material 214 can still fall into the recess 222 and subsequently enter the gap 216 between the shaft 226 and bottom liner 220. Such contaminant material 214, being electrically conductive and disposed in the gap 218, may electrically short the biased repeller 206 to the body 216 of arc chamber 208, thus causing an unscheduled maintenance and or plasma instabilities, which in turn affect the quality of the ion beam formed therefrom.

Figure 5:
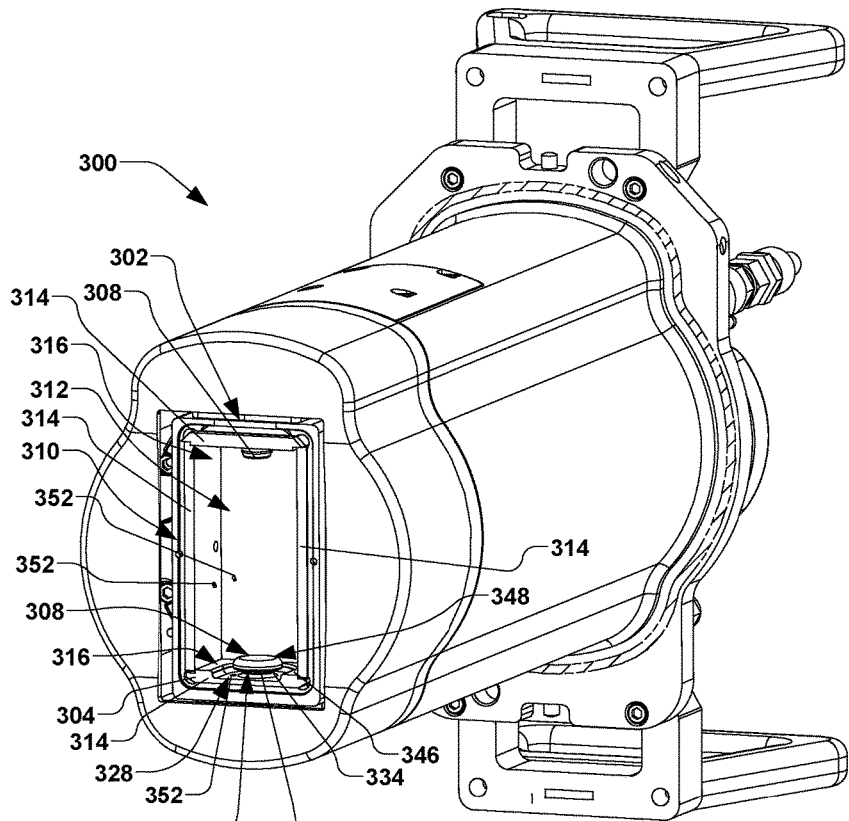
FIG. 5 illustrates a perspective view of an ion source and arc chamber having a liner with a raised lip in accordance with several examples of the present disclosure.
Figure 6:
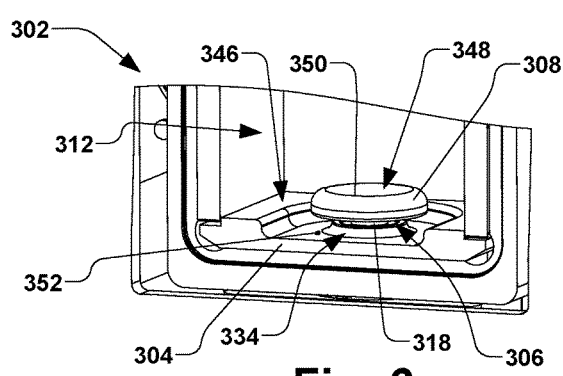
FIG. 6 is a blown-up portion of FIG. 5 showing the arc chamber having a liner with a raised lip in accordance with several examples of the present disclosure.

Accordingly, FIGS. 5 and 6 illustrate an ion source 300 of the present disclosure having a degree of similar structure and components to that of the ion source 300 of FIGS. 2 and 3; however, the ion source 300 of FIGS. 5 and 6 comprises an exemplary arc chamber 302 having a bottom liner 304 configured to substantially prevent such contaminant material from entering into an annular gap 306 between an electrode 308 (e.g., a repeller) and the bottom liner of the arc chamber, thus generally preventing premature failure of the ion source.

In accordance with one exemplary aspect, a body 320 of the arc chamber 302 generally defines and interior region 312 of the arc chamber. Further, one or more liners 314 are operably coupled to the body 310 of the arc chamber 302, wherein the one or more liners generally define an exposure surface 316 of the interior region 312 of the arc chamber. For example, the one or more liners 314 comprise at least the bottom liner 304. It should be noted that while the term "bottom" is presently used in reference to the bottom liner 304, the bottom liner need not be positioned at a lower-most position of the arc chamber 302. The exposure surface 316, for example, is configured to be exposed to, and at least partially confine, a plasma (not shown) generated within the interior region 312 of the arc chamber 302.

Figure 7:
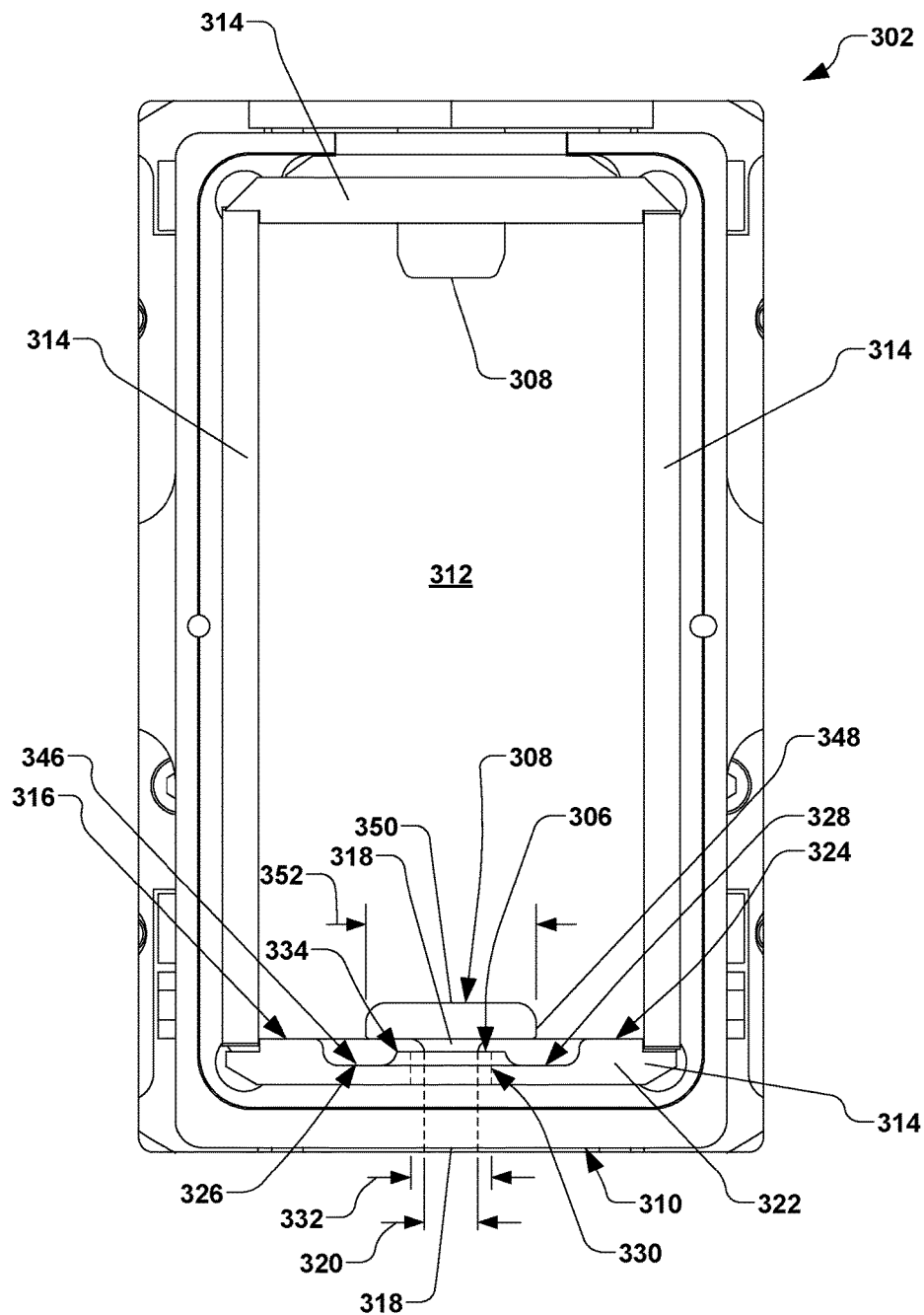
FIG. 7 is a plan view of an arc chamber for an exemplary ion source having a liner with a raised lip in accordance with several examples of the present disclosure.

According to one example, the electrode 308 (e.g., a repeller) comprises a shaft 318 having a first diameter 320 illustrated in FIG. 7, wherein the shaft passes through the body 310 and the bottom liner 304. The electrode 308 is electrically isolated from the body 310, as will be discussed infra, wherein the bottom liner 304 comprises a plate 322 having a first surface 324 with a recess 326 defined therein. The recess 326, for example, has a second surface 328 defined therein, wherein a hole 330 is further defined through the recess, as illustrated in greater detail in FIGS. 8 and 10. FIG. 9 illustrates a bottom view 327 of the bottom liner 304, while FIG. 10 illustrates section 329 of the bottom liner, where the hole 330, for example, is configured to pass the shaft 318 of the electrode 308 of FIGS. 5-7 therethrough. The hole 330 has a second diameter 332 that is larger than the first diameter 320 of the shaft 318 of FIG. 6. Accordingly, the annular gap 306 is defined between the plate 322 and the shaft 318, thereby electrically isolating the shaft from the bottom liner 304.

In accordance with the present disclosure, the plate 322 further comprises a lip 334 extending from the second surface 328 toward the first surface 324. As such, the lip 334 generally surrounds the hole 330 within the recess 326 in the bottom liner 304, while leaving the annular gap 304 between the plate 322 and the shaft 318 of the electrode 308 for electrical isolation therebetween. Accordingly, the lip 334 generally prevents particulate contaminants from entering the annular gap 306 due to gravitational forces, thus preventing electrical short circuiting between the electrode 308 and the body 310 and bottom liner 304 of the arc chamber 302.

According to one example, as illustrated in FIG. 10, the second surface 328 is recessed a first distance 336 from the first surface 324. In the present example, the lip 334 extends a second distance 338 from the second surface 328 toward the first surface 324. In the present example, the first distance 336 is approximately twice the second distance 338, but such distances can vary based on design of the electrode 308 of FIGS. 5-7 or other design criteria. As illustrated in FIG. 10, one or more of the first surface 324 and second surface 328 is generally planar. However, while not shown, one or more of the first surface 324 and second surface 328 may be sloped or have a curvilinear profile, and all such profiles are contemplated as falling within the scope of the present disclosure.

In accordance with another example, the lip 334 comprises a third surface 340 that is adjacent to a circumference 342 of the hole 330 of FIG. 8. In one example, the third surface 340 is generally planar, as illustrated in FIG. 10. Further, in accordance with another example, the recess 326, as illustrated in FIG. 8, is generally u-shaped when viewed along an axis 344 of the hole 330.

In accordance with yet another example, the lip 334 has a third diameter 346 associated therewith, as illustrated in FIG. 10. The electrode 308 of FIG. 7, for example, may comprise a repeller 348 (sometimes referred to as the anti-cathode) that is located on the bottom of the arc chamber 302. The repeller 348, for example, has a head 350 exposed to the plasma (not shown) generated within the interior region 312 of the arc chamber 302, wherein the head has a fourth diameter 352, and wherein the fourth diameter is greater than the third diameter 346 of the lip 334 of FIG. 10.

As provided in the example of FIGS. 5-7, the plate 322 defines a bottom surface 346 of the interior region 312 of the arc chamber 302, wherein the lip 334 generally prevents gravity from allowing particulate contaminants 352 from entering the annular gap 306. Accordingly, particulate contaminants 352 that delaminate from the within the arc chamber 302 will generally fall onto the bottom surface 346 due to gravity.

While the repeller 206 may mask line-of-sight to the gap 218 between the electrode and the body 216 of the arc chamber 208 of FIG. 2, small particles of material 214 may eventually make it into the gap. However, the lip 334 of the arc chamber 302 of FIGS. 5-7 generally prevent particulate contaminants 352 from entering the gap 306. Further, the lip 334 of the present disclosure provides a reduction in process gas leakage through the gap 306, as the raised structure of the lip reduces conductance. This highly volatile and typically conductive gas will coat any insulators used in the construction of the arc chamber and shorten their lifetimes.

Figure 11:
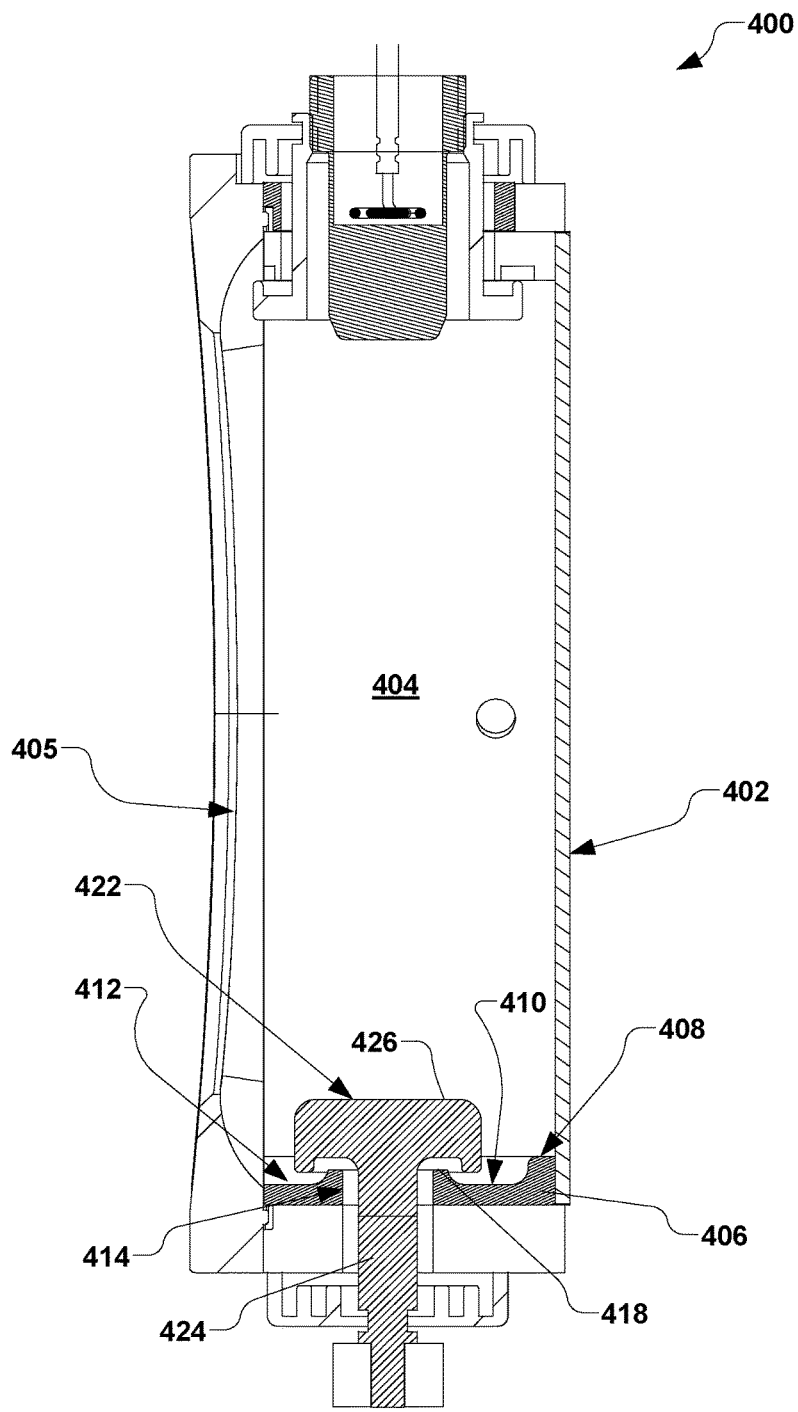
FIG. 11 illustrates a cross sectional view of an exemplary arc chamber with having an electrode with a labyrinth seal in accordance with various aspects of the present disclosure.

In accordance with another exemplary aspects of the present disclosure, FIG. 11 illustrates another exemplary an arc chamber 400. The arc chamber 400 of FIG. 11 is similar in many ways to the arc chamber 302 of FIG. 5, with the addition of features configured to substantially reduce a gas conductance associated with the gap 306. As illustrated in FIG. 11, the arc chamber 400 has a body 402 defining and interior region 404 of the arc chamber. The arc chamber 400, for example, comprises an arc slit 405 for extraction of ions from the arc chamber. A liner 406 is operably coupled to the body 402 of the arc chamber 400, wherein the liner has a first surface 408 and a second surface 410. The second surface 410, for example, is recessed from the first surface 408, therein defining a liner recess region 412. The liner 406, for example, further has a hole 414 defined therethrough in the liner recess region 412, as illustrated in greater detail in FIG. 12. The hole 414 of the liner 406, for example, has a first diameter 416, and wherein the liner further comprises a liner lip 418 extending upwardly from the second surface 410 toward the first surface 408. The liner lip 418 generally surrounds the hole 414 and has a second diameter 420 associated therewith.

Figure 12:
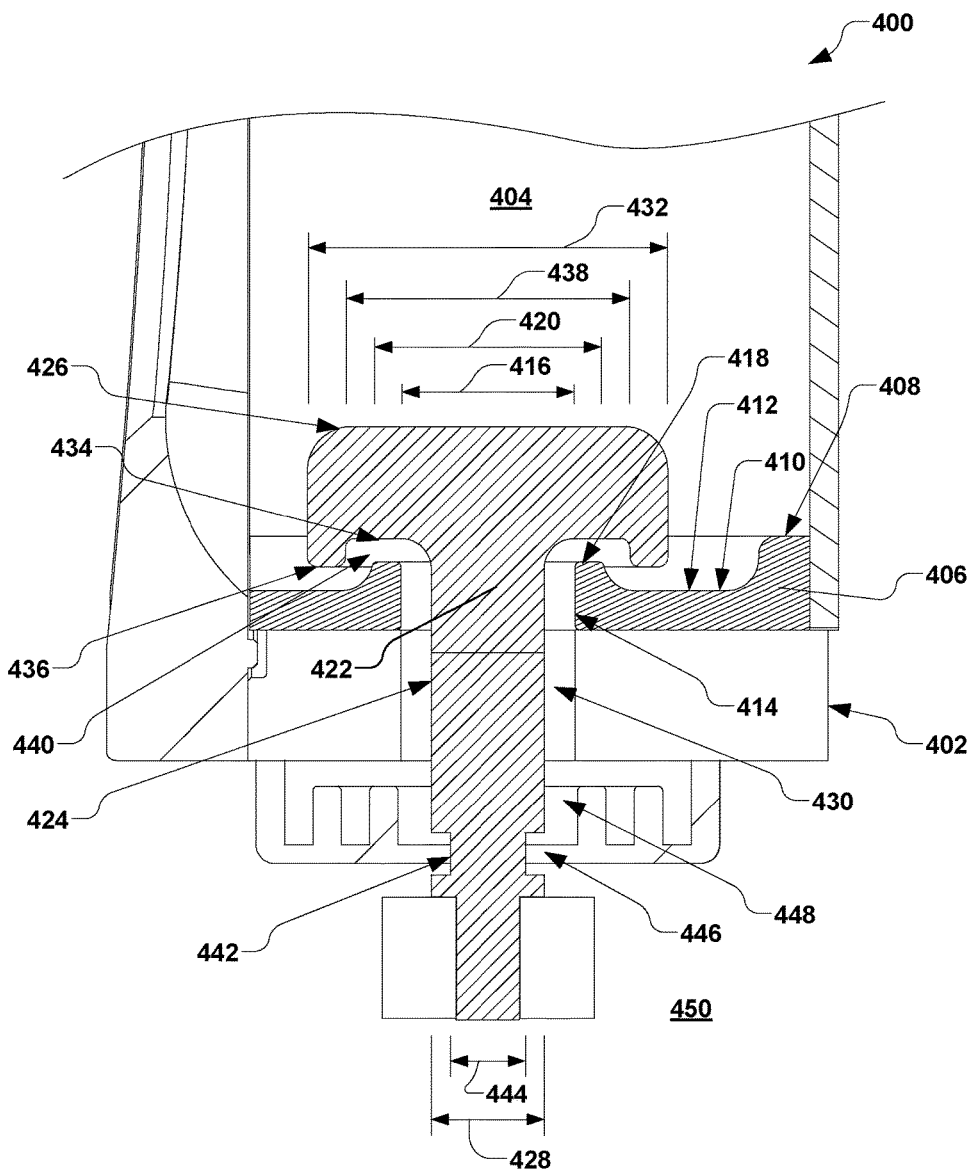
FIG. 12 is a blown-up portion of FIG. 11 showing the arc chamber having a liner with a raised lip and electrode with a lip in accordance with several examples of the present disclosure.

The arc chamber 400 of FIGS. 11-12 further comprises an electrode 422 (e.g., a repeller) having a shaft 424 and a head 426, wherein the shaft has a third diameter 428 that is less than the first diameter 416. Accordingly, the shaft 424 passes through the body 402 and the hole 414 in the liner 406 and is electrically isolated from the liner by an annular gap 430. The head 426 of the electrode 422, for example, has a fourth diameter 432 and comprises a third surface 434 having an electrode lip 436 extending downwardly from the third surface toward the second surface 410 of the liner 406. Thus, the electrode lip 436 has a fifth diameter 438 associated therewith, wherein the fifth diameter is between the second diameter 420 associated with the liner lip 418 and the fourth diameter 432 of the head 426 of the electrode 422. Accordingly, a spacing 440 between the liner lip 418 and electrode lip 436 (e.g., a substantial mating arrangement between the liner lip and electrode lip) generally prevents contaminants from entering the annular gap 430, as well as substantially limiting a gas conductance therethrough. In one example, the spacing 440 between the liner lip 418 and the electrode lip 436 is approximately equal to the annular gap 430 between the shaft 424 and the liner 406.

In accordance with another example, the shaft 424 of the electrode 422 further comprises an annular groove 442 defined therein, wherein the annular groove has a sixth diameter 444 associated therewith, wherein the sixth diameter is less than the third diameter 428 of the shaft. The annular groove 442, for example, is configured to accept a boron nitride seal 446, whereby the annular groove, in conjunction with the liner lip 418 and electrode lip 436 generally define a labyrinth seal 448, thus reducing a gas flow (e.g., gas conductance) into a annular gap 430 between the shaft 424 and the body 402 of the arc chamber 400. In one example, the boron nitride seal 446 engages the annular groove 442 of the shaft 424, therein sealing the interior region 404 of the arc chamber from an exterior region 450 thereof. The annular groove 442, for example, further protects the sealing surface between the boron nitride seal 446 and the shaft 424 from corrosive gases and by reducing conductance of the corrosive gases into this area.

Conventionally, the gas(es) utilized in an ion source can be fluorine or some other volatile corrosive species which, over time, can etch open the inner diameter of conventional boron nitride seals, thereby allowing volatile gases to escape and damage any nearby insulators, such as a cathode assembly insulator. Such etching and leakage of gases shorten the useful lifetime of the ion source and shutting down of the ion implanter is typical in order to replace the etched or damaged components.

The present disclosure provides an example arc chamber 400 of an ion source (e.g., the ion source 108 of FIG. 1 or ion source 200 of FIG. 2) in accordance with the present disclosure, whereby leakage of ion source gases is ameliorated. Thus, the present disclosure improves the lifetime of the seal 446, whereby the seal generally prevents leakage of gas out of the ion source. The liner lip 418 substantially mates with the electrode lip 436 to further reduce conductance of gas into the annular gap 430 between the shaft 424 and the corresponding hole 414 in the arc chamber body 402, as discussed above. The labyrinth seal design incorporated into the outer diameter of the shaft 424 of the electrode 422 (also referred to as the repeller or anti-cathode) accepts the boron nitride seal 446, thus further protecting the sealing surface from corrosive gases by reducing conductance of the corrosive gases into this area.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion source, comprising:
    an arc chamber having a body defining an interior region of the arc chamber;
    a liner operably coupled to the body of the arc chamber, wherein the liner is unitary and generally encloses the interior region of the arc chamber, the liner having a first surface and a second surface, wherein the second surface is recessed from the first surface, therein defining a liner recess region, the liner further having a hole defined therethrough in the liner recess region, wherein the hole has a first diameter, and wherein the liner further comprises a liner lip extending upwardly from the second surface toward the first surface, wherein the liner lip surrounds the hole and has a second diameter associated therewith; and
    an electrode having a shaft and a head, wherein the shaft has a third diameter that is less than the first diameter, wherein the shaft passes through the body and the hole in the liner and is electrically isolated from the liner by an annular gap, wherein the head has a fourth diameter and comprises a third surface having an electrode lip extending downwardly from the third surface toward the second surface, wherein the electrode lip has a fifth diameter associated therewith, wherein the fifth diameter is between the second diameter and the fourth diameter, wherein a spacing between the liner lip and electrode lip generally defines a labyrinth seal and generally prevents contaminants from entering the annular gap.

2. The ion source of claim 1, further comprising a boron nitride seal, wherein the shaft further comprises an annular groove defined therein having a sixth diameter, wherein the sixth diameter is less than the third diameter, and wherein the boron nitride seal engages the annular groove, therein sealing the interior region of the arc chamber from an exterior region thereof.

3. The ion source of claim 1, wherein the spacing between the liner lip and the electrode lip is approximately equal to the annular gap between the shaft and the liner.

4. The ion source of claim 3, wherein the shaft further comprises an annular groove defined therein, wherein the annular groove has a sixth diameter associated therewith, and wherein the sixth diameter is less than the third diameter.

5. The ion source of claim 4, wherein the annular groove is configured to accept a boron nitride seal, whereby the annular groove, in conjunction with the liner lip and electrode lip further define the labyrinth seal, therein reducing a gas conductance through the annular gap.

6. The ion source of claim 5, wherein the boron nitride seal engages the annular groove of the shaft, therein sealing the interior region of the arc chamber from an exterior region thereof.

7. The ion source of claim 5, wherein the annular groove protects a sealing surface between the boron nitride seal and the shaft from corrosive gases.

8. The ion source of claim 1, wherein the electrode comprises a repeller.

9. The ion source of claim 1, wherein the labyrinth seal is further defined in an outer diameter of the shaft, wherein the labyrinth seal is configured to accept a boron nitride seal.

10. The ion source of claim 9, wherein the labyrinth seal generally protects a sealing surface of the shaft from corrosive gases associated with the ion source by reducing conductance of the corrosive gases into an area associated with the boron nitride seal.

11. An ion source, comprising:
an arc chamber having a body defining an interior region of the arc chamber;
a liner operably coupled to the body of the arc chamber, wherein the liner is unitary and generally encloses the interior region of the arc chamber, the liner having a first surface and a second surface, wherein the second surface is recessed from the first surface, therein defining a liner recess region, the liner further having a hole defined therethrough in the liner recess region, wherein the hole has a first diameter, and wherein the liner further comprises a liner lip extending upwardly from the second surface toward the first surface, wherein the liner lip surrounds the hole and has a second diameter associated therewith; and
an electrode having a shaft and a head, wherein the shaft has a third diameter that is less than the first diameter, wherein the shaft passes through the body and the hole in the liner and is electrically isolated from the liner by an annular gap, wherein the head has a fourth diameter and comprises a third surface having an electrode lip extending downwardly from the third surface toward the second surface, wherein the electrode lip has a fifth diameter associated therewith, wherein the fifth diameter is between the second diameter and the fourth diameter, wherein a spacing between the liner lip and electrode lip generally defines a labyrinth seal and generally prevents contaminants from entering the annular gap, and wherein the shaft further comprises an annular groove defined therein having a sixth diameter, wherein the sixth diameter is less than the third diameter; and
a boron nitride seal, wherein the boron nitride seal engages the annular groove, therein sealing the interior region of the arc chamber from an exterior region thereof.

12. The ion source of claim 11, wherein the annular groove, in conjunction with the liner lip and electrode lip further define the labyrinth seal, therein reducing a gas conductance through the annular gap.

13. The ion source of claim 11, wherein the annular groove protects a sealing surface between the boron nitride seal and the shaft from corrosive gases.

14. The ion source of claim 11, wherein the labyrinth seal generally protects a sealing surface of the shaft from corrosive gases associated with the ion source by reducing conductance of the corrosive gases into an area associated with the boron nitride seal.

15. The ion source of claim 11, wherein the spacing between the liner lip and the electrode lip is approximately equal to the annular gap between the shaft and the liner.

16. The ion source of claim 11, wherein the electrode comprises a repeller.

17. The ion source of claim 11, further comprising an arc slit for extraction of ions from the arc chamber.

18. An apparatus for preventing a leakage of gases from an interior region of a body of an arc chamber to an exterior region of the body of the arc chamber, the apparatus comprising:
a liner having a first surface and a second surface, wherein the second surface is recessed from the first surface, therein defining a liner recess region, wherein the liner is unitary and generally encloses the interior region of the arc chamber, the liner further having a hole defined therethrough in the liner recess region, wherein the hole has a first diameter, and wherein the liner further comprises a liner lip extending upwardly from the second surface toward the first surface, wherein the liner lip surrounds the hole and has a second diameter associated therewith; and
an electrode having a shaft and a head, wherein the shaft has a third diameter that is less than the first diameter, wherein the shaft passes through the body and the hole in the liner and is electrically isolated from the liner by an annular gap, wherein the head has a fourth diameter and comprises a third surface having an electrode lip extending downwardly from the third surface toward the second surface, wherein the electrode lip has a fifth diameter associated therewith, wherein the fifth diameter is between the second diameter and the fourth diameter, wherein a spacing between the liner lip and electrode lip is approximately equal to the annular gap between the shaft and the liner and generally defines a labyrinth seal and generally prevents contaminants from entering the annular gap, and wherein the shaft further comprises an annular groove defined therein having a sixth diameter, wherein the sixth diameter is less than the third diameter; and a boron nitride seal, wherein the boron nitride seal engages the annular groove, therein sealing the interior region of the arc chamber from the exterior region thereof, wherein the labyrinth seal generally protects a sealing surface of the shaft from corrosive gases associated with the interior region of the arc chamber by reducing conductance of the corrosive gases into an area associated with the boron nitride seal.

19. The apparatus of claim 18, further comprising an arc slit for extraction of ions from the arc chamber.

20. The apparatus of claim 18, wherein the electrode comprises a repeller.

* * * * *